United States Patent [19]

Hikata et al.

[11] Patent Number: 5,434,130
[45] Date of Patent: Jul. 18, 1995

[54] METHOD OF PREPARING OXIDE SUPERCONDUCTING WIRE

[75] Inventors: Takeshi Hikata; Kenichi Sato, both of Osaka, Japan

[73] Assignee: Sumitomo Electric Industries, Ltd., Osaka, Japan

[21] Appl. No.: 186,219

[22] Filed: Jan. 25, 1994

Related U.S. Application Data

[63] Continuation of Ser. No. 854,129, Mar. 19, 1992, abandoned.

[30] Foreign Application Priority Data

Mar. 20, 1991 [JP] Japan ................................ 3-056697

[51] Int. Cl.$^6$ .............................................. H01L 39/24
[52] U.S. Cl. ...................................... 505/433; 29/599; 148/96; 505/500; 505/501
[58] Field of Search ........................... 148/96; 29/599; 505/430, 433, 492, 500, 501

[56] References Cited

FOREIGN PATENT DOCUMENTS 64-48324  2/1989  Japan ...................... 505/739
1-183102  7/1989  Japan ...................... 505/740
3-53902   3/1991  Japan ...................... 505/740

*Primary Examiner*—George Wyszomierski
*Attorney, Agent, or Firm*—Pennie & Edmonds

[57] ABSTRACT

In a method of preparing an oxide superconducting wire comprising the steps of filling up raw material powder for an oxide superconductor in a metal sheath and rolling the same in this state, frictional force on surfaces of rolls employed for rolling is increased in the rolling step in order to improve denseness of the raw material powder, thereby improving the critical current density of the oxide superconducting wire. In order to increase the frictional force, films having large frictional force are formed on the roll surfaces, a coating material is applied to the roll surfaces during rolling, or the roll surfaces are roughened, for example.

7 Claims, No Drawings

METHOD OF PREPARING OXIDE SUPERCONDUCTING WIRE

This is a continuation of application Ser. No. 7,854,129 filed Mar. 19, 1992, now abandoned.

BACKGROUND OF THE INVENTION

1. Field of the Invention

The present invention relates to a method of preparing an oxide superconducting wire, and more particularly, it relates to improvement for increasing the critical current density as well as the length of an oxide superconducting wire.

2. Description of the Background Art

In recent years, superconductive materials of ceramics, i.e., oxide superconductive materials, are watched with interest due to higher critical temperatures thereof. For example, bismuth, yttrium and thallium oxide superconductive materials, which exhibit high critical temperatures of about 110 K., 90 K. and 120 K. respectively, are expected for practical application.

For example, it is known that a bismuth oxide superconductor contains phases having critical temperatures of 110 K., 80 K. and 10 K. respectively. It is also known that the 110 K. phase has a 2223 composition in a composition of Bi-Sr-Ca-Cu or (Bi, Pb)-Sr-Ca-Cu with Bi being partially replaced by Pb, while the 80 K. phase has a 2212 composition in the same composition.

In a method of preparing an oxide superconductor, an oxide superconductor or raw material powder therefor is filled up in a metal sheath of silver or a silver alloy, for example, and subjected to deformation processing and heat treatment, so that the oxide superconductor or the raw material powder contained in the metal sheath is sintered and brought into a superconducting state. This method is advantageously applied to preparation of a long superconducting wire, for example.

In order to apply an elongated oxide superconducting wire to a cable or a magnet, it is necessary to provide a high critical current density uniformly along its longitudinal direction. In order to increase the critical current density, it is necessary to improve the density of the powder which is filled up in the metal sheath. However, the powder, which is generally filled up in the metal sheath and then subjected to deformation processing such as wiredrawing or rolling, may be insufficiently consolidated in such deformation processing, and deteriorated in denseness.

SUMMARY OF THE INVENTION

Accordingly, an object of the present invention is to provide a method of preparing an oxide superconducting wire, which can improve denseness of an oxide superconductor or raw material powder therefor, being filled up in a metal sheath, thereby providing a high critical current density uniformly along its longitudinal direction.

The present invention is directed to a method of preparing an oxide superconducting wire comprising the steps of filling up raw material powder for an oxide superconductor in a metal sheath and rolling the same in this state, and in order to solve the aforementioned problem, the rolling step comprises a step of increasing frictional force on surfaces of rolls employed for the rolling.

Throughout the specification, the term "raw material powder for an oxide superconductor" includes powder of an oxide superconductor already exhibiting superconductivity, raw material powder, not yet exhibiting superconductivity, capable of forming an oxide superconductor, and a mixture of such powder materials.

In relation to the aforementioned rolling step, such a step may be carried out after heat treatment, or rolling and heat treating steps may be repeated.

When the rolling step is repeated a plurality of times, it is preferable to make frictional force on surfaces of rolls employed for the subsequent rolling larger than that for the preceding rolling. The reason is that the preceding rolling is carried out with the intention of applying uniform deformation to the metal sheath, while the purpose of the subsequent rolling is to apply larger load rather than deformation.

The frictional force on the surfaces of the rolls for the rolling may be increased by various methods such as a method of providing the surfaces of the rolls with films having larger frictional force than the roll surfaces, a method of performing rolling while applying a coating material onto the roll surfaces in the said method, a method of roughening the roll surfaces, and the like, for example.

According to the present invention, the frictional force on the surfaces of the rolls is so increased as to apply a larger load to the powder which is filled up in the metal sheath, thereby further densifying the powder and improving bonding properties between grain boundaries.

According to the present invention, therefore, the raw material powder for an oxide superconductor, which is filled up in the metal sheath, is so densified that it is possible to obtain a long oxide superconducting wire having a high critical current density.

When the method of forming films on the surfaces of the rolls is employed for increasing the frictional force on the roll surfaces, such film portions may be deformed or converted if a long wire is rolled. In this case, it is preferable to roll the wire while applying a coating material to the surfaces of the rolls. More preferably, the coating material applied to the roll surfaces is transferred to the wire.

The foregoing and other objects, features, aspects and advantages of the present invention will become more apparent from the following detailed description of the present invention.

DESCRIPTION OF THE PREFERRED EMBODIMENT $Bi_2O_3$, $PbO$, $SrCO_3$, $CaCO_3$ and $CuO$ were mixed to prepare powder containing Bi, Pb, Sr, Ca and Cu in composition ratios of 1.8:0.4:2:2.2:3.

This powder was heat treated at 800° C. for 8 hours, and pulverized in an automatic mortar for 2 hours. Thereafter the as-formed powder was heat treated at 860° C. for 8 hours, and again pulverized in a similar manner to the above.

The as-obtained fine powder was filled up in silver pipes of 30 mm in outer diameter and 20 mm in inner diameter, and subjected to wiredrawing and rolling. Such samples were drawn into 1 mm in outer diameter, while surfaces of rolls employed for rolling these samples were under the following conditions:

(A) maintained in general states with no change;
(B) roughened with an abrasive;
(C) baked with fluororesin;
(D) coated with a volatile coating material before rolling; and (E) coated with the volatile coating material in the condition (D) during rolling.

After the rolling, the samples were heat treated in the atmosphere at 845° C. for 50 hours, and then gradually cooled. The samples were again rolled under conditions similar to the above, and heat treated at 840° C. for 50 hours.

Critical current densities of the as-obtained oxide superconducting wires were measured at a temperature of 77.3 K. over lengths of 1 m, 10 m, 100 m and 1000 m respectively, while values of denseness in portions of 1 m in length were also measured. Table 1 shows the results.

TABLE 1

| Rolling Condition | A | B | C | D | E |
|---|---|---|---|---|---|
| Wire Length (m) | Critical Current Density (A/cm$^2$) | | | | |
| 1 | 15000 | 22000 | 30000 | 32000 | 32200 |
| 10 | 11000 | 20000 | 24500 | 15000 | 27000 |
| 100 | 8000 | 15000 | 22000 | 10000 | 24000 |
| 1000 | 4000 | 12000 | 20000 | 5000 | 22000 |
| Denseness in Portion of 1 m (g/cm$^3$) | 5.6 | 6.1 | 6.3 | 6.4 | 6.4 |

As understood from Table 1, densities in superconductor portions were increased and higher critical current densities were obtained under the conditions (B), (C), (D) and (E) as compared with the sample under the general condition (A). Under the condition (D), the critical current density was reduced as the wire was elongated, since the coating material was peeled with rolling. Under the conditions (D) and (E), the coating materials were transferred to the wires after rolling, while it was possible to remove these coating materials with acetone.

Although the present invention has been described in detail, it is clearly understood that the same is by way of example only and is not to be taken by way of limitation, the scope of the present invention being limited only by the terms of the appended claims.

What is claimed is:

1. A method of preparing an oxide superconducting wire comprising the steps of:

filling a metal sheath with a raw material powder for an oxide superconductor;

performing a first rolling to apply uniform deformation to said metal sheath;

increasing frictional force on surfaces of rolls employed for rolling by roughening said surfaces of rolls with an abrasive or applying a coating material to said surfaces of rolls, wherein said coating material provides a greater frictional force on the surfaces of said rolls;

performing a second rolling which includes applying an increased load greater than that load applied to said metal sheath during said first rolling or said metal sheath, said increased load being applied by using said roughened rolls or coated rolls in said second rolling of said metal sheath; and performing heat treatment after said second rolling to form a superconductor wire.

2. A method of preparing an oxide superconducting wire in accordance with claim 1, wherein said oxide superconductor is a Bi-Sr-Ca-Cu or (Bi, Pb)-Sr-Ca-Cu oxide superconductor.

3. A method of preparing an oxide superconducting wire in accordance with claim 1, wherein said metal sheath is made of silver or a silver alloy.

4. A method of preparing an oxide superconducting wire in accordance with claim 1 wherein said step of coating said rolls is performed simultaneously with said second rolling.

5. A method of preparing an oxide superconducting wire in accordance with claim 4, wherein said step of applying said coating material to said surface of rolls results in the transfer of said coating material to said metal sheath.

6. A method of preparing an oxide superconducting wire in accordance with claim 1, further comprising performing, at least one after said heat treatment step, the steps of:

performing an additional rolling on said wire using said altered rolls; and performing an additional heat treatment.

7. A method of preparing an oxide superconducting wire in accordance with claim 1, further comprising the step of performing heat treatment between said first and second rolling steps.

* * * * *